United States Patent
Shih et al.

(10) Patent No.: US 6,797,627 B1
(45) Date of Patent: Sep. 28, 2004

(54) DRY-WET-DRY SOLVENT-FREE PROCESS AFTER STOP LAYER ETCH IN DUAL DAMASCENE PROCESS

(75) Inventors: Hsin-Ching Shih, Changhua (TW); Yi-Nien Su, Kaohsiung (TW); Li-Te S. Lin, Hsin-chu (TW); Li-Chie Chiao, Yang-mei (TW)

(73) Assignee: Taiwan Semiconductor Manufacturing Company Ltd., Hsin-Chu (TW)

(*) Notice: Subject to any disclaimer, the term of this patent is extended or adjusted under 35 U.S.C. 154(b) by 4 days.

(21) Appl. No.: 10/005,803

(22) Filed: Dec. 5, 2001

(51) Int. Cl.$^7$ ............................................. H01L 21/301
(52) U.S. Cl. ...................... 438/694; 438/700; 438/725; 438/745
(58) Field of Search ................................ 438/694, 699, 438/700, 702, 709, 718, 725, 745; 134/1.3

(56) References Cited

U.S. PATENT DOCUMENTS

| | | | |
|---|---|---|---|
| 5,567,271 A | 10/1996 | Chu et al. ............... | 156/659.11 |
| 5,660,682 A | 8/1997 | Zhao et al. .................. | 438/715 |
| 5,882,489 A | 3/1999 | Bersin et al. ........... | 204/192.35 |
| 6,037,664 A | 3/2000 | Zhao et al. .................. | 257/758 |
| 6,114,259 A * | 9/2000 | Sukharev et al. ........... | 438/789 |
| 6,153,530 A * | 11/2000 | Ye et al. ...................... | 438/720 |
| 6,204,192 B1 * | 3/2001 | Zhao et al. ................. | 438/723 |
| 6,248,665 B1 | 6/2001 | Bao et al. .................... | 438/687 |
| 6,265,320 B1 | 7/2001 | Shi et al. .................... | 438/725 |
| 6,323,121 B1 * | 11/2001 | Liu et al. .................... | 438/633 |
| 6,436,808 B1 * | 8/2002 | Ngo et al. .................. | 438/623 |
| 6,465,352 B1 * | 10/2002 | Aoki .......................... | 438/689 |
| 6,503,840 B2 * | 1/2003 | Catabay et al. ............. | 438/694 |

FOREIGN PATENT DOCUMENTS

TW        432526        9/2001        ....... H01L/21/3065

\* cited by examiner

*Primary Examiner*—Kin-Chan Chen
(74) *Attorney, Agent, or Firm*—Haynes and Boone, LLP

(57) ABSTRACT

A new method is provided for the removal of polymer, possibly mixed with copper oxide residue, from exposed surfaces after an etch stop layer has been removed. The exposed surfaces are treated with a first plasma etch followed by a DI water rinse after which a second plasma etch of the exposed surfaces is performed. By selecting the chemistry and the conditions for the first and the second plasma etch, polymer residues and formed copper oxide residues are removed from the exposed surfaces.

14 Claims, 3 Drawing Sheets

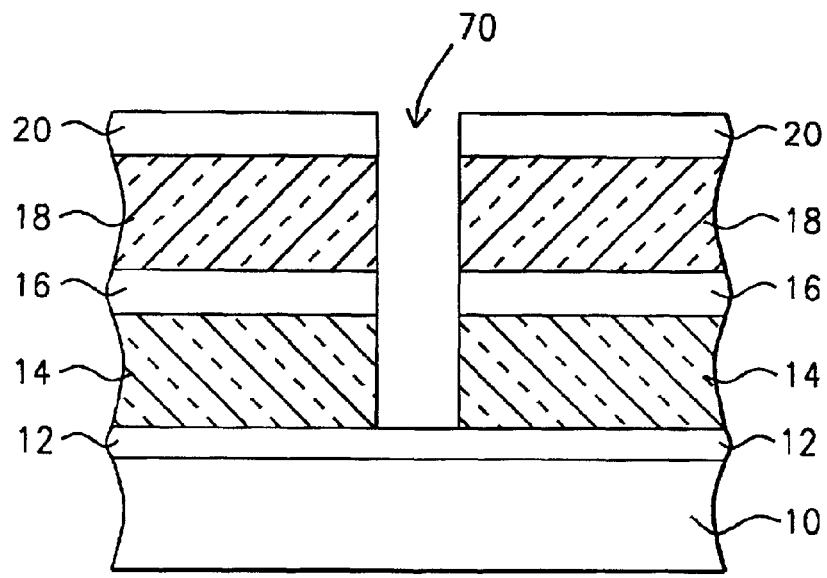
FIG. 1 – Prior Art
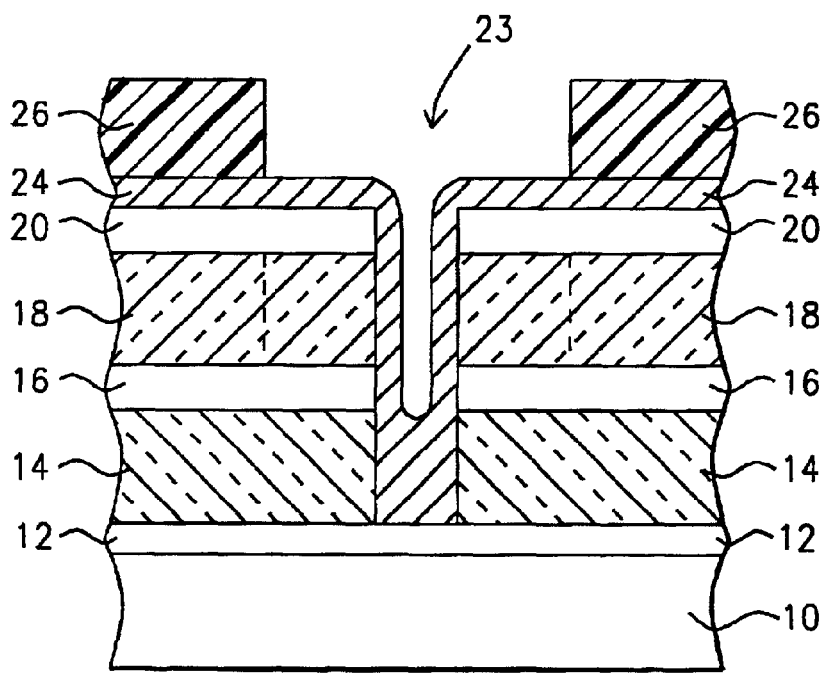
FIG. 2 – Prior Art

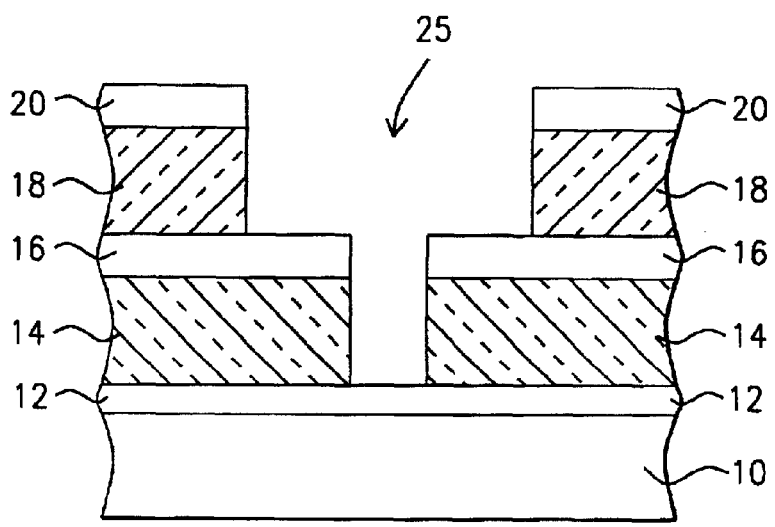
FIG. 3 – Prior Art
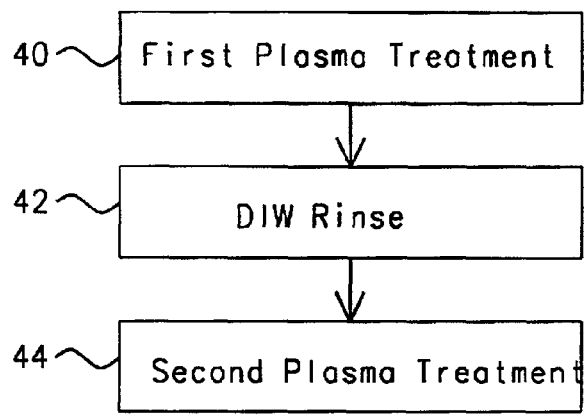
FIG. 4
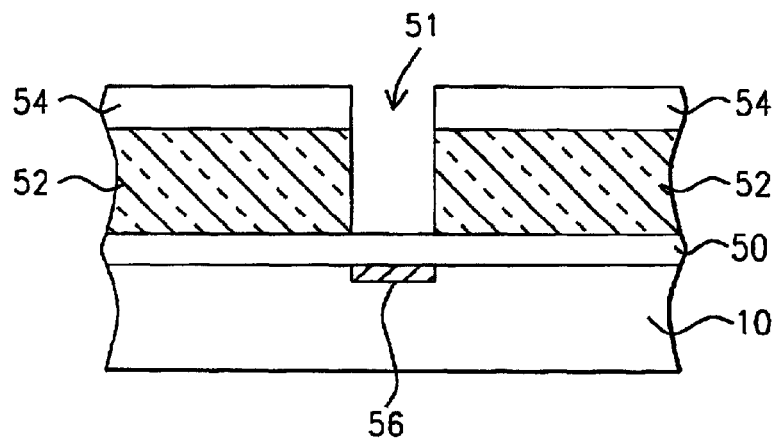
FIG. 5a

DRY-WET-DRY SOLVENT-FREE PROCESS AFTER STOP LAYER ETCH IN DUAL DAMASCENE PROCESS

BACKGROUND OF THE INVENTION (1) Field of the Invention

The invention relates to the fabrication of integrated circuit devices, and more particularly, to a method of removing polymer from a surface that has been etched as part of creating a damascene structure.

(2) Description of the Prior Art

One of the more important aspects of fabricating very and ultra large scale integration (VLSI and ULSI) semiconductor devices is the fabrication of metal interconnect lines and vias that provide the interconnection of integrated circuits in semiconductor devices. The invention specifically addresses interconnect aspects as they relate to the creation of dual damascene structures. For the creation of a dual damascene structure, an insulating layer or a dielectric layer, such as silicon oxide, is patterned with trenches for conductive lines and openings for vias. The openings and trenches are simultaneously filled with a metal, such as aluminum, and serve to interconnect active and/or passive elements of an integrated circuit. The dual damascene process is also used for forming multilevel conductive lines of metal, such as copper, in insulating layers, such as polyimide, of multilayer substrates on which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed.

Dual damascene is an improvement over single damascene because it permits the filling of both the conductive grooves and vias with metal at the same time, thereby eliminating processing steps. The dual damascene process requires two masking steps to form first the via pattern after which the pattern for the conductive lines is formed.

For the dual damascene process, the processing steps can follow three approaches, as follows:

Approach 1, the via is created first. The vias are formed by resist patterning after which an etch through a triple layer dielectric stack is performed. This is followed by patterning the conductor in the top layer of $SiO_2$ thereby using a layer of SiN as an etch stop layer.

Approach 2, the conductor first process. The conductor pattern is formed by resist patterning and by etching the conductor pattern into an upper dielectric layer, using an SiN layer that is deposited between two layers of dielectric as an etch stop layer. This is followed by via resist patterning and etching through the thin layer of SiN and a lower dielectric layer.

Approach 3, the etch stop layer first. The first $SiO_2$ layer is deposited, followed by the thin layer of SiN as etch stop, followed by the via resist patterning and etching of the SiN layer. This is followed by depositing the top $SiO_2$ layer and then the conductor patterning. In etching the conductor pattern in the top $SiO_2$ layer, the etching process will be stopped by the SiN layer except where the via holes are already opened in the SiN layer thereby completing the via holes etching in the first $SiO_2$ layer simultaneously.

Etch stop layers are frequently used during the process of creating dual damascene structures. The art is aggressively moving toward semiconductor devices with sub-micron and deep sub-micron device features. For these devices, the creation of via holes and the effect that the deposits of polymers has on the performance of via plugs become critical issues. An etch stop layer must typically be removed from the bottom of a via hole in order to contact the underlying layer of metal. Remnants of polymers typically have a severely negative effect on resistive contact performance of via plugs and must therefore be removed as part of the process of creating via plugs. The invention provides a method that effectively removes such polymers. This is a requirement for the creation of devices with deep sub-micron dimensions, which comprises the creation of via holes with a 0.13 μm diameter.

U.S. Pat. No. 6,265,320 BI (Shi et al.) shows a $H_2$ plasma post treatment and low k process.

U.S. Pat. No. 5,660,682 (Zhao et al.) shows a $H_2$ plasma post clean.

U.S. Pat. No. 6,204,192 BI (Zhao et al.) shows a plasma clean process.

U.S. Pat. No. 5,882,489 (Bersin et al.), U.S. Pat. No. 5,567,271 (Chu et al.), U.S. Pat. No. 6,248,665 BI (Bao et al.) and U.S. Pat. No. 6,037,664 (Zhao et al.) are related processes.

SUMMARY OF THE INVENTION

A principle objective of the invention is to remove polymers, possibly mixed with copper oxide residue, from semiconductor surfaces.

Another objective of the invention is to enable the removal of polymers, possibly mixed with copper oxide residue, without detrimental effects on exposed semiconductor surfaces.

Yet another objective of the invention is to improve resistive performance of via plugs by removing contact inhibiting materials from surfaces over which contact plugs are formed.

A still further objective of the invention is to optimize the creation of contact plugs for devices having deep sub-micron device dimensions.

In accordance with the objectives of the invention a new method is provided for the removal of polymers, possibly mixed with copper oxide residue, from exposed surfaces after an etch stop layer has been removed. The exposed surfaces are treated with a first plasma etch followed by a DI water rinse after which a second plasma etch of the exposed surfaces is performed. By selecting the chemistry and the conditions for the first and the second plasma etch, polymer residues and formed copper oxide residues are removed from the exposed surfaces.

BRIEF DESCRIPTION OF THE DRAWINGS

FIGS. 1 through 3 show prior art processing steps that are required for the creation of a dual damascene structure, as follows:

FIG. 1 shows a cross section of a substrate surface over which two layers of dielectric surrounded by etch stop layers have been deposited, an opening for a via plug has been etched through the deposited layers.

FIG. 2 shows a cross section after a layer of Anti Reflective Coating (ARC) has been deposited, a photoresist mask has been formed for the etch of the interconnect line trench.

FIG. 3 shows a cross section after the interconnect trench has been etched, the ARC has been removed as has the photoresist mask.

FIG. 4 shows a flow diagram of steps that are provided by the invention after a layer of etch stop has been removed.

FIGS. 5a through 5d show depositions of polymers and the removal of polymers, possibly mixed with copper oxide residue, from exposed surfaces of a via opening.

DESCRIPTION OF THE PREFERRED EMBODIMENTS

Figure 5B:
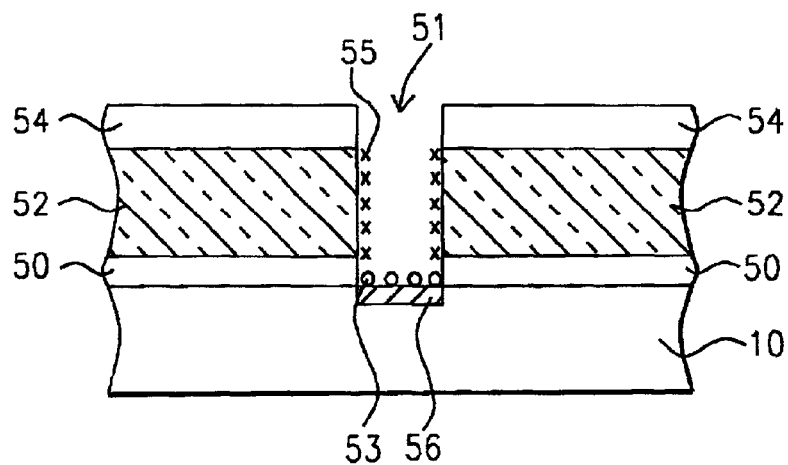

A conventional process of creating a dual damascene structure is first reviewed, this in order to better address concerns of the invention. FIGS. 1 through 3 are used for this purpose.

FIG. 1 shows a cross section of the initial steps in creating a dual damascene structure. The dual damascene structure contains a lower part, also refereed to as a via plug, and an upper part, also referred to as an interconnect line trench.

Specifically highlighted in the cross section of FIG. 1 are the following elements:

10 is a semiconductor surface, typically the surface of a monocrystalline silicon substrate 12 is a first etch stop layer, typically created to a thickness of about 1,000 Angstrom and containing SiON, that has been deposited over the surface of substrate 10, layer 12 serves as an etch stop for the etch of the via opening 14 is a first layer of dielectric created over the surface of the first etch stop layer 12; the via plug will be contained in the first layer of dielectric 16 is a second etch stop layer created over the surface of the first layer 14 of dielectric, also typically created to a thickness of about 1,000 Angstrom and also containing SiON; layer 16 serves as the etch stop layer for the interconnect line trench etch 18 is a second layer of dielectric created over the surface of the second etch stop layer 16; the interconnect line trench will be contained in the second layer of dielectric 20 is a third etch stop layer; etch stop layer 20 serves to protect the surface of the second layer 18 of dielectric during the via etch and the interconnect line etch and additionally serves as a stress relieve layer over the dielectric layer 18

22 is an opening which has a diameter of the via plug and which has been etched through the third etch stop layer 20, the second layer 18 of dielectric, the second etch stop layer 16 and the first layer 14 of dielectric; the etch of opening 22 is stopped by etch first etch stop layer 12.

The lower section (roughly below the top surface of the second stop layer 16) of opening 22 forms the plug or via section of the dual damascene structure. The upper section (roughly above the top surface of the second stop layer 16) needs to be widened (etched) in order to form the trench or interconnect pattern of the dual damascene structure.

FIG. 2 shows how, before the etch for the trench of the dual damascene structure takes place, an Anti Reflective Coating (ARC), layer 24, has been deposited inside opening 22 and over the top surface of layer 20 of SiON. This layer 24 serves the purpose of allowing the creation of a via opening of small dimensions by eliminating or diminishing effects of light reflection and dispersion during the exposure for the creation of the opening 23. This layer 24 further serves the function of protecting the etch stop layer 12 at the bottom of this opening 23. The ARC layer 24 also allows, due to its protective nature, for a decrease in the thickness of layer 12 whereby layer 12 continues to serve as a stop layer during the first etch (to create the lower section of the dual damascene structure). The deposition of layer 24 of ARC further allows for a decrease in the thickness of the Inter Metal Dielectric (IMD) layer 18, thereby providing a level of control over the profile of the created opening of the dual damascene structure.

Photoresist layer 26, deposited to a thickness of about 8,000 Angstrom, forms a positive photoresist material and is deposited over the surface of layer 24 and patterned to created the trench profile 23 of the dual damascene structure. The second layer of dielectric 18 can now be etched.

FIG. 3 shows a cross section after the interconnect line trench has been completed. The layer 26 of patterned and developed photoresist (the photo mask as shown in layer 26, FIG. 2) has been removed from the surface of layer 24 of ARC, the layer 24 of ARC has been removed using methods of Chemical Mechanical Polishing and ARC etch. The opening 25 now has the cross section of a dual damascene structure. Not shown in the cross section of FIG. 3 is the removal of the first etch stop layer 12 from the bottom surface of opening 25, that is an issue that will be addressed by the invention.

Since the invention addresses the etch of a stop layer that is used in the process of creating a dual damascene structure, some of the aspects of stop layers and the etching thereof will be mentioned first.

A considerable number of materials can be used for the creation of an etch stop layer such as aluminum, silicon, titanium, zirconium, hafnium, chromium, molybdenum, tungsten, copper, silver, gold, platinum, combinations thereof, conductive alloys thereof such as titanium-tungsten alloy and CVD silicon, silicon nitride, nitride, carbide and composite films like oxide/carbide and oxide/nitride.

The preferred material that is to be applied for the creation of a layer of etch stop material of the invention comprises nitride, carbide and composite films like oxide/carbide, oxide/nitride.

As an example of the creation of a layer of etch stop material can be cited the deposition of a layer of $Si_xN_y$ that is deposited using CVD to a thickness of between about 200 and 400 Angstrom.

As examples of etching a layer of etch stop material can be cited using a SiON or SiN removal process with etchant gasses $CH_3F/Ar/O_2$ at a temperature between about 10 and 20 degrees C., a pressure of between about 40 and 60 mTorr with an etch time of between about 40 and 60 seconds. A silicon nitride layer can also be wet etched using a buffered oxide etchant (BOE). The BOE may comprise a mixed solution of fluoroammonium and fluorohydrogen (7:1) and phosphoric acid solution. A silicon nitride layer can also be etched using anisotropic RIE using $CHF_3$ or $SF_6$—$O_2$ as an etchant. The preferred method of removing silicon nitride is an isotropic wet etch process using hot phosphoric acid. A silicon nitride layer can also be dipped into phosphoric acid ($H_3PO_4$) to be removed. Openings in a layer of nitride can be anisotropically etched with a plasma gas containing fluorocarbon gases such as $CF_4/CHF_3$ chemistry or $Co/C_4F_8$ chemistry, in a commercial RIE etcher or an electron cyclotron resonance (ECR) plasma reactor.

Solvents are typically applied after etching of the etch stop layer has been completed. These solvents are applied in order to remove accumulated deposits of polymer from the surface of the underlying layer of copper and from the sidewalls of the via opening that has been created as part of the process of creating a dual damascene structure.

The polymers may however become trapped inside the opening of the dual damascene structure, resulting in high contact resistance between the dual damascene structures and the underlying layer of copper with which the dual damascene makes electrical contact.

The trend in the art is further to use dielectrics (for the layers of dielectric in which the dual damascene structure is created) of low dielectric constant value, this in order to improve overall device performance. Low-k dielectrics are known to be relatively porous and are therefore prone to absorb a significant amount of the solvent, further having a negative effect on the performance of the dielectric and the created device. As a further consideration in the application of solvents must be included the cost of the solvents that are used, which tends to be high.

The impact of using solvents, as part of the creation of dual damascene structures, can be summarized as follows:
- negative impact on contact resistance
- more difficult to apply for sub-micron openings
- degrade the performance of surrounding low-k dielectric
- high cost
- considerations of the impact of disposed solvent on the environment.

The term polymer comprises numerous materials that play a role in of the creation of semiconductor devices. For instance, low-k polymer materials include polyimides, fluorinated polyimides, polysilsequioxane, bisbenzocyclobutene (BCB), parlene F, parlene N and amorphous polytetrafluorothylene. Other polymers are polyamide, teflon, electron resist, solid organics or inorganics, PMMA (poly-methyl-methacrylate), teflon is a polymer made from PTFE (polytetrafluoroethylene), polycarbonate (PC), polysterene (PS), polyoxide (PO) and poly polooxide (PPO).

In many cases, the term polymer is used generically to identify layers of semiconductor material that accumulate on exposed surfaces as a result of processing steps that are performed in creating semiconductor devices. The invention limits itself to C—F based and Cu—F based polymers that are formed as part of the process of removing an etch stop layer from the bottom surface of an opening that has been created through one or more layers of dielectric, whereby the dielectric is typically low-k dielectric.

Because of the above highlighted issues that are raised by the use of solvent for the removal of polymer residues, an alternate method must be provided for the removal of these polymer residues for openings of sub-micron dimensions. The invention provides such a method, specifically aimed at the creation of openings having a diameter in the range of 0.13 $\mu$m or less.

Specifically, the invention provides the following step for treating the surface of the structure in which openings have been created. These steps may be applied for openings that are created as part of creating a dual damascene structure but are not limited to openings created for a dual damascene structure only.

After the removal of the etch stop layer, using for instance a layer of etch stop material and one of the methods of removing the etch stop material as cited above, the invention provides the steps of:
1. apply a first dry plasma treatment to the surface in order to clean the surface, the chemistry that is applied for this plasma treatment is not restricted to any particular chemistry, then
2. apply a DIW rinse to the surface, and then
3. apply a second dry plasma treatment to the surface, the chemistry that is applied for this plasma treatment is a reducing chemistry meaning that the preferred second plasma treatment of the invention is a $H_2$ based plasma treatment.

The invention is further highlighted using the flow diagram of FIG. 4. Shown in this flow diagram are the steps of:
1) step 40, the first plasma treatment of the invention; the key requirements of this first plasma treatment are:
   - the first plasma treatment must chemically interact with the accumulated polymer deposits, thus enabling the removal of the polymer residues
   - the byproducts of the first plasma treatment must be water soluble, and
   - the first plasma treatment must not damage the low-k dielectric that is used for the creation of openings therein.

A wide range of plasma treatments meets these requirements. Specifics of the first plasma treatment do therefore not need to be provided at this time beyond the stated requirement for the first plasma treatment.

Examples of the applied first plasma treatment are $N_2/O_2$ based plasma treatment, $N_2/H_2$ based plasma treatment, $O_2$ based plasma treatment, $N_2$ based plasma treatment and $H_2$ based plasma treatment.

As an example of the processing conditions of the first plasma treatment can be cited the following conditions: apply isotropic plasma etching in an etchant comprising nitrogen, performed in a parallel HDP reactor in-situ, in a plasma containing $H_2$ at a flow rate of between about 30 and 60 sccm, in an organ carrier gas at a flow rate sufficient to maintain a pressure between about 5 and 15 mTorr said HDP reactor and at an rf power of between about 400 and 1,200 Watts TCP and between about 1,000 and 1,500 Watts bias.

2) step 42, a DIW rinse applied to the surface of the structure. This rinse is preferably performed at room temperature and under atmospheric pressure, a DIW rinse at elevated temperatures is to be avoided since such a rinse will oxidize the exposed surface of the copper contact points over which the openings, including openings for a dual damascene structure, have been created 3) step 44, the second plasma treatment of the invention; the key requirements of this second plasma treatment are:
   - the second plasma treatment must reduce oxide from the surface of the exposed copper contact points, and
   - the second plasma treatment must not damage the low-k dielectric that is used for the creation of openings therein.

It is preferred that the second plasma treatment of the invention is a $H_2$ based plasma treatment.

As an example of the processing conditions of the second plasma treatment can be cited the following conditions: apply isotropic plasma etching in an etchant comprising nitrogen, performed in a parallel HDP reactor in-situ, in a plasma containing $H_2$ at a flow rate of between about 30 and 60 sccm, in an organ carrier gas at a flow rate sufficient to maintain a pressure between about 5 and 15 mTorr said HDP reactor and at an rf power of between about 400 and 1,200 Watts TCP and between about 1,000 and 1,500 Watts bias.

The effects of the steps of the invention are further highlighted using FIGS. 5a through 5d, as follows:

FIG. 5a shows a cross section of a semiconductor surface over the surface of which an opening has been created, highlighted in the cross section of FIG. 5a are the following elements;

10 is the cross section of a semiconductor surface, typically the surface of a monocrystalline silicon substrate; semiconductor devices (not shown) have been created in or on the surface of layer 10, a point of electrical contact 56, comprising copper, has been provided in the surface of layer 10, the conductive contact plug (not shown) that is created in opening 51 makes contact with the contact point 56 that has been provided in the surface of layer 10

50, a first etch stop layer, this etch stop layer serves as the etch stop for the etch of opening 51; the preferred material of the invention for etch stop layer 50 comprises nitride, carbide and composite films such as oxide/carbide, oxide nitride and the like

51, an opening created for the purpose of creating a conductive plug through layer 52 of dielectric

52, a layer of dielectric through which a conductive contact plug (not shown) is to be formed

54, a second etch stop layer which protects the surface of layer 52 during the etch of opening 51

56, a point of electrical contact, comprising copper, that has been provided in the surface of layer 10.

The cross section of FIG. 5b is a continuation of the cross section of FIG. 5a. The cross section of FIG. 5b shows the following:

first etch stop layer 50 has been removed from the bottom of opening 51

53, polymer, potentially mixed with copper oxidation, has accumulated over the bottom of the opening 51 and the surface of layer 56 of copper as a result of the etch of layer 50, and

55, polymer that has accumulated over the sidewalls of opening 51.

Figure 5C:
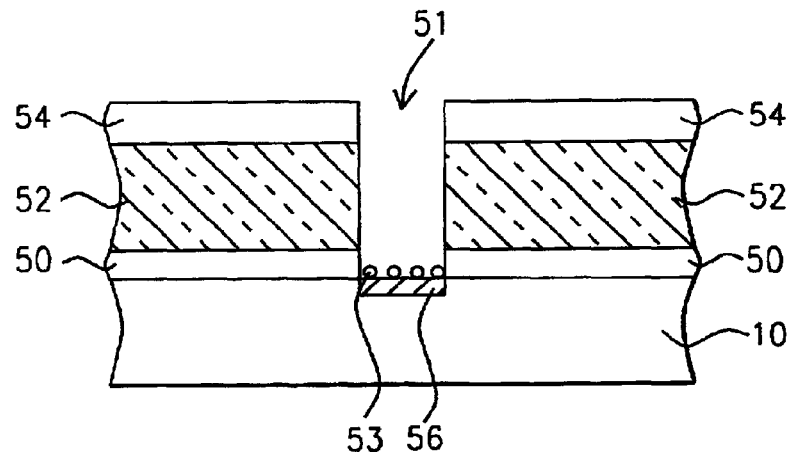

The cross section of FIG. 5c shows how, after the first plasma treatment of the invention (step 40, FIG. 4) followed by the DIW rinse (step 42, FIG. 4), the polymer 55 is essentially removed from the sidewalls of opening 51; potentially, polymer is still present over the bottom surface of the openings 51; oxidation of the surface of the point of electrical contact 56 may also have taken place.

Figure 5D:
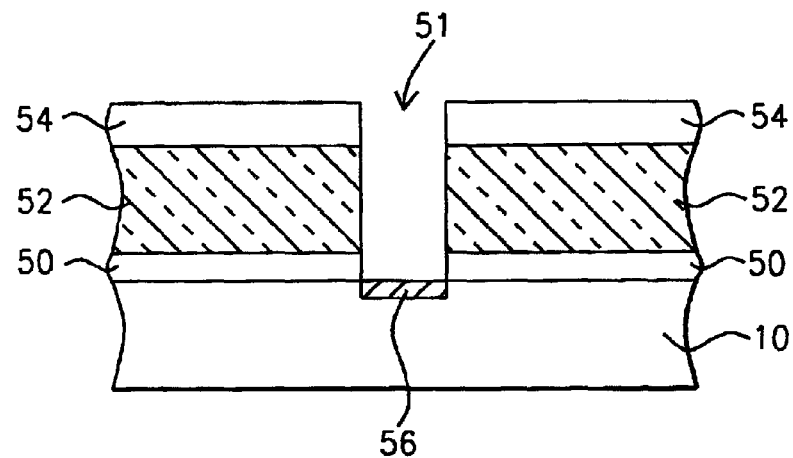

The cross section of FIG. 5d shows how, after the second plasma treatment of the invention (step 44, FIG. 4) remnants 53 of polymer and potential copper oxidation have been removed from the surface of point of electrical contact 56.

It is clear from the cross section that is shown in FIG. 5d that a contact opening 51 has been created that provides a clean and low resistivity interface with contact point 56 while all deposits of polymer over surfaces of opening 51 have been removed.

The invention has therefore removed the previously experienced negative effects of using a solvent to remove polymer from an opening after the bottom surface of this opening has been etched so that a contact plug, created in this opening, can contact an underlying layer of copper.

Specifically, the invention has provided for:

eliminating a negative impact on contact resistance as a result of polymer removal made it easier to create sub-micron openings eliminated potential degradation of the performance of surrounding low-k dielectric eliminated the high cost of removing polymer eliminated considerations of the environmental impact of disposing solvent.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalent thereof.

What is claimed is:

1. A method for removal of polymers, possibly mixed with copper oxide residue, from exposed surfaces, comprising:

providing a substrate, at least one copper point of electrical contact having been provided in or on said substrate;

depositing an etch stop layer over said substrate;

depositing at least one layer of dielectric over said etch stop layer;

creating at least one opening through said at least one layer of dielectric, said at least one opening having sidewalls and a bottom surface;

removing said etch stop layer from said bottom surface of said at least one opening, exposing said at least one copper point of electrical contact, said removal of said etch stop layer causing accumulation of polymers, possibly mixed with copper oxide residues, over exposed surfaces, said exposed surfaces comprising the surface of said at least one layer of dielectric, further comprising said sidewalls of said at least one opening, further comprising said exposed at least one copper point of electrical contact;

applying a first plasma treatment to said exposed surfaces;

applying a DI water (DIW) rinse to said exposed surfaces, said DI water rinse preferably being performed at room temperature and under atmospheric pressure, said DIW rinse combined with said first plasma treatment essentially removing said polymers from said sidewalls of said at least one opening; and applying a second plasma treatment to said exposed surfaces, said second plasma treatment essentially removing said polymers and said copper oxide residues from said bottom surface of said at least one opening.

2. The method of claim 1, said first plasma treatment providing chemically interaction with said accumulated polymer deposits, thus enabling the removal of the polymer residues.

3. The method of claim 1, byproducts of said first plasma treatment being water soluble.

4. The method of claim 1, said first plasma treatment not causing damage to exposed surfaces of said at least one layer of dielectric.

5. The method of claim 1, said first plasma treatment being selected from the group consisting of $N_2/O_2$ based plasma treatment and $N_2/H_2$ based plasma treatment and $O_2$ based plasma treatment and $N_2$ based plasma treatment and $H_2$ based plasma treatment.

6. The method of claim 5, said $N_2/O_2$ based plasma treatment comprising applying isotropic plasma etching in an etchant comprising nitrogen, performed in a parallel HDP reactor in-situ, in a plasma containing $N_2/O_2$ at a flow rate of between about 30 and 60 sccm, in an argon carrier gas at a flow rate sufficient to maintain a pressure between about 5 and 15 mTorr said HDP reactor and at an rf power of between about 400 and 1,200 Watts TCP and between about 1,000 and 1,500 Watts bias.

7. The method of claim 5, said $O_2$ based plasma treatment comprising applying isotropic plasma etching in an etchant comprising nitrogen, performed in a parallel HDP reactor in-situ, in a plasma containing $O_2$ at a flow rate of between about 30 and 60 sccm, in an argon carrier gas at a flow rate sufficient to maintain a pressure between about 5 and 15 mTorr said HDP reactor and at an rf power of between about 400 and 1,200 Watts TCP and between about 1,000 and 1,500 Watts bias.

8. The method of claim 5, said $N_2$ based plasma treatment comprising applying isotropic plasma etching in an etchant comprising nitrogen, performed in a parallel HDP reactor in-situ, in a plasma containing $N_2$ at a flow rate of between about 30 and 60 sccm, in an argon carrier gas at a flow rate sufficient to maintain a pressure between about 5 and 15 mTorr said HDP reactor and at an rf power of between about 400 and 1,200 Watts TCP and between about 1,000 and 1,500 Watts bias.

9. The method of claim 1, said at least one layer of dielectric comprising a low-k dielectric.

10. The method of claim 1, said second plasma treatment being sensitive to removing copper oxide.

11. The method of claim 1, said second plasma treatment being sensitive to not chemically interacting with said at least one layer of dielectric.

12. The method of claim 1, said second plasma treatment being a $H_2$ based plasma treatment.

13. The method of claim 12, said $H_2$ based plasma treatment comprising applying isotropic plasma etching in an etchant comprising nitrogen, performed in a parallel HDP reactor in-situ, in a plasma containing $H_2$ at a flow rate of between about 30 and 60 sccm, in an argon carrier gas at a flow rate sufficient to maintain a pressure between about 5 and 15 mTorr said HDP reactor and at an rf power of between about 400 and 1,200 Watts TCP and between about 1,000 and 1,500 Watts bias.

14. The method of claim 1, said etch stop layer deposited over said substrate comprising a material selected from the group consisting of nitride and carbide and composite films such as oxide/carbide and oxide nitride.

* * * * *